United States Patent
Cho et al.

(10) Patent No.: US 9,633,845 B2
(45) Date of Patent: Apr. 25, 2017

(54) METHOD OF MANUFACTURING A SUBSTRATE HAVING A CRYSTALLIZED LAYER AND A LASER CRYSTALLIZING APPARATUS FOR THE SAME

(71) Applicant: SAMSUNG DISPLAY CO., LTD., Yongin-si, Gyeonggi-Do (KR)

(72) Inventors: Joowoan Cho, Yongin-si (KR); Byoungho Cheong, Yongin-si (KR); Byoungkwon Choo, Yongin-si (KR); Jeongkyun Na, Yongin-si (KR); Sanghoon Ahn, Yongin-si (KR); Hyunjin Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/857,302

(22) Filed: Sep. 17, 2015

(65) Prior Publication Data
US 2016/0284546 A1 Sep. 29, 2016

(30) Foreign Application Priority Data
Mar. 27, 2015 (KR) .......................... 10-2015-0043299

(51) Int. Cl.
*H01L 21/02* (2006.01)
*H01L 29/04* (2006.01)
(Continued)

(52) U.S. Cl.
CPC ........ *H01L 21/02675* (2013.01); *B23K 26/00* (2013.01); *H01L 21/02532* (2013.01);
(Continued)

(58) Field of Classification Search
None
See application file for complete search history.

(56) References Cited

U.S. PATENT DOCUMENTS

| | | | |
|---|---|---|---|
| 4,823,354 A | 4/1989 | Znotins et al. | |
| 6,027,960 A | 2/2000 | Kusumoto et al. | |
| (Continued) | | | |

FOREIGN PATENT DOCUMENTS

| | | |
|---|---|---|
| KR | 1020120025300 | 3/2012 |
| KR | 1020140008127 | 1/2014 |
| KR | 1020140094354 | 7/2014 |

OTHER PUBLICATIONS

K.M. A. El-Kader, "Time-Resolved Reflectivity Technique:Improvement and Applications", International Journal of Photoenergy, vol. 1, 1999, pp. 1-5.

*Primary Examiner* — Jack Chen
(74) *Attorney, Agent, or Firm* — F. Chau & Associates, LLC

(57) ABSTRACT

A method of manufacturing a substrate includes: irradiating, along a first path, a laser beam emitted from a source onto a substrate, wherein the substrate includes a target layer of the laser beam, and wherein the substrate is disposed on a stage; and irradiating, along a second path, a portion the laser beam, which was emitted from the source and reached the target layer, by reflecting the laser beam back onto the target layer using a reflection mirror. An area of a second region of the target layer is greater than an area of a first region of the target layer, wherein the laser beam is irradiated along the second path in the second region, and the laser beam is irradiated along the first path in the first region.

15 Claims, 5 Drawing Sheets

(51) Int. Cl.
    *H01L 29/16* (2006.01)
    *H01L 29/66* (2006.01)
    *B23K 26/00* (2014.01)

(52) U.S. Cl.
    CPC ........ *H01L 21/02691* (2013.01); *H01L 29/04* (2013.01); *H01L 29/16* (2013.01); *H01L 29/6675* (2013.01)

(56) References Cited

U.S. PATENT DOCUMENTS

| | | |
|---|---|---|
| 2008/0067515 A1 | 3/2008 | Park et al. |
| 2008/0213986 A1 | 9/2008 | Kusumoto et al. |
| 2012/0057148 A1 | 3/2012 | Voronov et al. |
| 2014/0017861 A1* | 1/2014 | Kim .................... H01L 29/6675 438/166 |
| 2014/0202213 A1 | 7/2014 | Park et al. |

* cited by examiner

METHOD OF MANUFACTURING A SUBSTRATE HAVING A CRYSTALLIZED LAYER AND A LASER CRYSTALLIZING APPARATUS FOR THE SAME

CROSS-REFERENCE TO RELATED APPLICATION

This application claims priority under 35 U.S.C. §119 to Korean Patent Application No. 10-2015-0043299, filed on Mar. 27, 2015, in the Korean Intellectual Property Office, the disclosure of which is incorporated by reference herein in its entirety.

TECHNICAL FIELD

Exemplary embodiments of the inventive concept relate to a method of manufacturing a substrate having a crystallized layer and a laser crystallizing apparatus for the method.

DESCRIPTION OF THE RELATED ART

In general, in a thin film transistor liquid crystal display (TFT LCD) or an active matrix organic light-emitting display (AM OLED) apparatus, pixel emission is controlled by using TFTs electrically connected to each pixel. A variety of TFTs may be employed in a TFT LCD or an AM OLED apparatus. For example, a TFT with a polysilicon active layer having high mobility, etc., may be used. When manufacturing such a TFT, a process of crystallizing amorphous silicon in the polysilicon is performed.

However, a large amount of energy may be used in this process.

SUMMARY

According an exemplary embodiment of the inventive concept, a method of manufacturing a substrate includes: irradiating, along a first path, a laser beam emitted from a source onto a substrate, wherein the substrate includes a target layer, and wherein the substrate is disposed on a stage; and irradiating, along a second path, a portion of the laser beam, which was emitted from the source and reached the target layer, by reflecting the laser beam back onto the target layer using a reflection mirror. An area of a second region of the target layer is greater than an area of a first region of the target layer, wherein the laser beam is irradiated along the second path in the second region, and the laser beam is irradiated along the first path in the first region.

The second region may include the first region.

The reflection mirror may include a convex reflection surface.

The method may further include moving the stage in a first direction. The second region may include a region of the target layer outside the first region in a second direction opposite to the first direction.

The method may further include moving the stage in a first direction. The second region may include a region of the target layer outside the first region in the first direction.

The method may further include moving the stage in a first direction. The second region may include a region of the target layer outside the first region in a second direction opposite to the first direction and a region of the target layer outside the first region in the first direction.

The first path may not be perpendicular to the target layer.
The target layer may include a silicon layer.
The silicon layer may include an amorphous silicon layer.
The target layer may be crystallized.

According to an exemplary embodiment of the inventive concept, a method of manufacturing a substrate includes: irradiating, along a first path, a laser beam emitted from a source onto a substrate, wherein the substrate includes a target layer of the laser beam, and wherein the substrate is formed on a stage; irradiating, along a second path, a portion of the laser beam, which was emitted from the source and reached the target layer, by reflecting the laser beam back onto the target layer using a first reflection mirror; irradiating, along a third path, a portion of the laser beam, which was reflected from the first reflection mirror back to the target layer, by reflecting the laser beam back onto the target layer using a second reflection mirror; and moving the stage in a first direction. A second region of the target layer, in which the laser beam is irradiated along the second path, is a region of the target layer outside a first region of the target layer, in which the laser beam is irradiated along the first path, in a second direction opposite to the first direction, and a third region of the target layer, in which the laser beam is irradiated along the third path, is a region of the target layer outside the first region in the first direction.

The first reflection mirror may include two mirrors.
The target layer may include a silicon layer.
The silicon layer may include an amorphous silicon layer.
The target layer may be crystallized.

According to an exemplary embodiment of the inventive concept, a method of manufacturing a substrate to have a crystallized layer comprises: providing a laser beam onto a substrate disposed in a chamber; reflecting a portion of the laser beam that contacted the substrate back onto the substrate by using a reflecting mirror disposed in the chamber; and moving a stage on which the substrate is disposed while the substrate is contacted with the laser beam.

The laser beam may first pre-heat a target layer on the substrate and then process the target layer.

The target layer may include amorphous silicon.

The laser beam may be provided from a single laser source.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
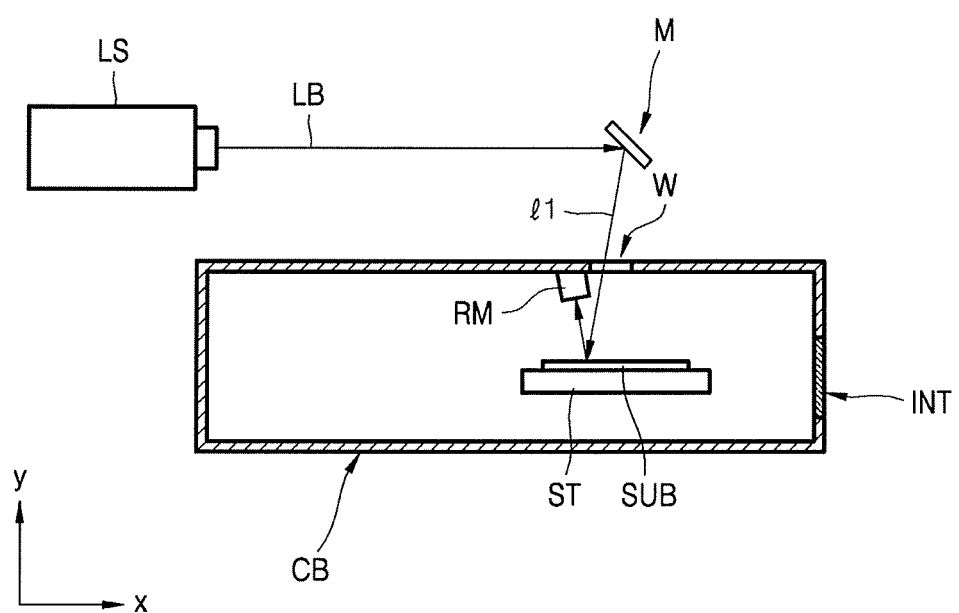
FIG. 1 illustrates a schematic diagram of a side portion of a laser crystallizing apparatus according to an exemplary embodiment of the inventive concept.

Exemplary embodiments of the inventive concept will now be described more fully with reference to the accompanying drawings. The inventive concept may, however, be embodied in many different forms and should not be construed as being limited to the exemplary embodiments set forth herein.

Like reference numerals in the drawings may denote like elements, and thus, their descriptions may be omitted.

It will be understood that when a component, such as a layer, a film, a region, or a plate, is referred to as being "on" another component, the component can be directly on the other component or intervening components may be present thereon. Sizes and thicknesses of components in the drawings may be exaggerated for convenience of explanation. Accordingly, the following exemplary embodiments are not limited thereto.

In the following exemplary embodiments, the x-axis, the y-axis and the z-axis are not limited to three axes of the rectangular coordinate system. For example, the x-axis, the y-axis, and the z-axis may be perpendicular to one another, or may represent different directions that are not perpendicular to one another.

Figure 2:
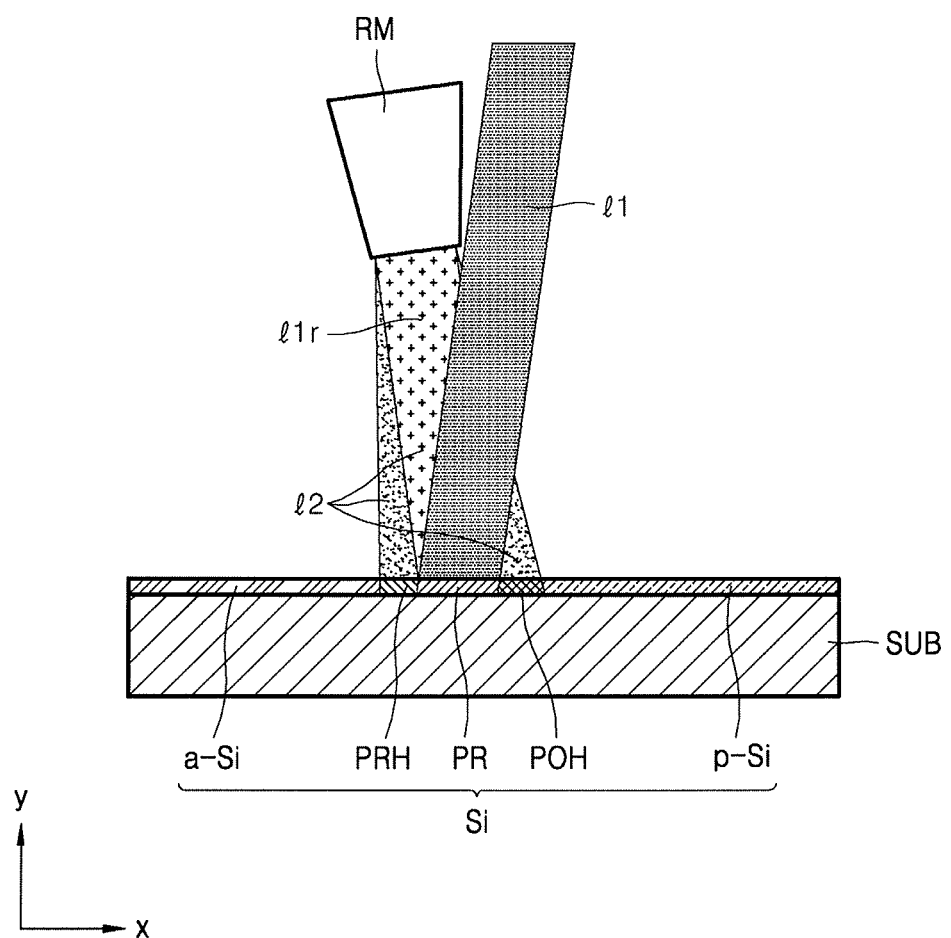
FIG. 2 is a part of FIG. 1 and illustrates a schematic diagram of a side portion of a laser-beam path with respect to a substrate, according to an exemplary embodiment of the inventive concept.

FIG. 1 illustrates a schematic diagram of a side portion of a laser crystallizing apparatus according to an exemplary embodiment of the inventive concept, and FIG. 2 is a part of FIG. 1 and illustrates a schematic diagram of a side portion of a laser-beam path with respect to a substrate SUB. The laser crystallizing apparatus according to the present exemplary embodiment includes a chamber CB, a stage ST, a laser source LS, and a reflection mirror RM.

The chamber CB may be a space where a laser beam LB is irradiated onto a silicon layer Si on the substrate SUB. The silicon layer Si is a target layer of the laser-beam LB. As illustrated in FIG. 1, the chamber CB has a substrate inserting hole INT through which the substrate SUB is inserted. The substrate inserting hole INT is located in a side of the chamber CB (a +x direction). In addition, the chamber CB has a window W through which the laser beam LB passes. The window W is located on an upper side of the chamber CB (a +y direction). This way, the laser beam LB reaches the targeted silicon layer Si on the substrate SUB disposed inside the chamber CB. The chamber CB may include a substrate exit hole for removing the substrate SUB, after laser-beam annealing is completed, to the outside. The substrate exit hole may not be the substrate inserting hole INT. Alternatively, the substrate inserting hole INT may function as the substrate exit hole.

The stage ST is disposed within the chamber CB, and the substrate SUB, on which an amorphous silicon layer is formed, may be disposed on the stage ST. For example, an end effector of a transport robot moves from the outside of the chamber CB to the inside of the chamber CB via the substrate inserting hole INT while the substrate SUB, on which the amorphous silicon layer is formed, is held by the end effector of the transport robot. The end effector is a gripping/handling device at the end of a robotic arm, for example. Upon insertion of the substrate SUB, on which the amorphous silicon layer is formed, into the chamber, a plurality of pins penetrating the stage ST move upward (the +y direction) and support the substrate SUB. Then, the end effector moves from the inside of the chamber CB to the outside of the chamber CB via the substrate inserting hole INT. As the pins move downward (a −y direction), the substrate SUB, on which the amorphous silicon layer is formed, may still be disposed on the stage ST. It is to be understood that the substrate SUB, on which the amorphous silicon layer is formed, may be disposed on the stage ST by other methods. A location of the substrate SUB in the chamber CB may change. For example, during a crystallization process using a laser beam, the stage ST may move in a +x direction, and accordingly, the substrate SUB disposed on the stage ST may move in the +x direction.

When the substrate SUB, on which the amorphous silicon layer is formed, is disposed on the stage ST, the laser beam LB emitted from the laser source LS passes through the window W of the chamber CB by way of a mirror M, and then, reaches the amorphous silicon layer formed on the substrate SUB along a first path l1. The laser beam LB emitted from the laser source LS may also pass through an optical system including a homogenizer, a lens, etc., and then, may pass through the window W of the chamber CB.

A portion of the silicon layer Si formed on the substrate SUB, to which the laser beam LB is irradiated along the first path l1, may be referred to as a processing region PR. In the processing region PR, as the laser beam LB is irradiated along the first path l1, amorphous silicon is in a melted state or a mostly-melted state. The amorphous silicon is melted by energy of the laser beam LB irradiated to the processing region PR. However, the energy of the laser beam LB irradiated along the first path l1 is not all transmitted to the processing region PR of the silicon layer Si.

Table 1 below shows absorption rates and reflection rates of an amorphous silicon layer, a silicon layer Si in a melted state, and a crystallized polysilicon layer.

TABLE 1

|  | Absorption rate (%) | Reflection rate (%) |
|---|---|---|
| Amorphous silicon layer | 58 | 42 |
| Melted silicon layer | 51 | 49 |
| Polysilicon layer | 70 | 30 |

For example, if energy of 400 mJ/cm$^2$ is incident on the silicon layer Si due to the laser beam LB irradiated along the first path l1, the silicon layer Si becomes an amorphous silicon layer in an initial processing region PR. Thus, energy of 232 mJ/cm$^2$ is absorbed by the silicon layer Si, and energy of 168 mJ/cm$^2$ is reflected by the silicon layer Si. In a conventional laser crystallizing apparatus, the energy of 168 mJ/cm$^2$ dissipates.

However, since the laser crystallizing apparatus according to the present exemplary embodiment includes the reflection mirror RM, the amount of energy loss may be reduced to less than 168 mJ/cm$^2$. For example, the reflection mirror RM reflects a portion of a laser beam LB that reached the silicon layer Si, but was reflected from the silicon layer Si, along a reflection path l1r. Accordingly, the laser beam LB reflected along the reflection path l1r is reflected from the reflection mirror RM to the silicon layer Si again along a second path l2. Therefore, all of the energy of 168 mJ/cm$^2$ does not dissipate. For example, at least a portion of this energy is absorbed by the silicon layer Si and used, thereby increasing energy use efficiency of the laser crystallizing apparatus. The first path l1 may not be perpendicular to an amorphous silicon layer a-Si that is the target layer formed on the substrate SUB on the stage ST. Thus, the reflection mirror RM may not disturb an initial movement of the laser beam LB along the first path l1.

A region of the silicon layer Si on the substrate SUB where the laser beam LB is irradiated along the first path l1 is referred to as a first region, and a region where the laser beam LB is irradiated along the second path l2 is referred to as a second region. An area of the second region may be greater than an area of the first region. For example, as illustrated in FIG. 2, the second region may include the first region. A reflection surface of the reflection mirror RM may be curved, for example, the reflection surface may be a convex surface instead of a plane surface.

FIG. 2 illustrates that the first region is the processing region PR and the second region includes the processing region PR, a preheating region PRH, and a post-heating region POH. As described above, during a crystallization process using a laser beam LB, the stage ST may move in the +x direction, and accordingly, the substrate SUB disposed on the stage ST may move in the +x direction. Here, the preheating region PRH is an external portion of the first region in a −x direction opposite to the +x direction, and the post-heating region POH is an external portion of the first region in the +x direction.

A greater grain size of a polysilicon layer that is crystallized through a laser crystallization method indicates good electrical characteristics such as an increased mobility of the polysilicon layer. To increase the grain size of the polysilicon layer that is crystallized through a laser crystallization method, a temperature of a portion of the amorphous silicon layer to be melted or mostly melted may be increased before a process of melting or mostly melting the amorphous silicon layer is performed. For this to happen, two laser sources may be used so that, before a first laser beam is irradiated onto the amorphous silicon layer to melt or mostly melt the amorphous silicon layer, a second laser beam having a lower intensity than the first laser beam is irradiated onto a portion of the amorphous silicon layer, which is to be irradiated with the first laser beam. This will preheat the portion of the amorphous silicon layer, which is to be irradiated with the first laser beam. However, the use of two laser beams may increase manufacturing costs, and since portions of the laser beams emitted from the two laser sources are reflected, energy efficiency may be low.

However, in the laser crystallizing apparatus according to the present exemplary embodiment, one laser source LS may be used to pre-heat and process the amorphous silicon layer a-Si, and thus the energy efficiency may be increased. For example, during a process of crystallizing the amorphous silicon layer a-Si formed on the substrate SUB by using a laser beam LB while the stage ST moves in the +x direction, the amorphous silicon layer a-Si passes the preheating region PRH before passing the processing region PR. Accordingly, since the amorphous silicon layer a-Si is preheated before being melted or mostly melted in the processing region PR, the grain size may be increased when the amorphous silicon layer a-Si is finally crystallized.

As described above, if energy of 400 mJ/cm² is incident on the silicon layer Si due to the laser beam LB irradiated along the first path l1, the silicon layer Si becomes the amorphous silicon layer when the laser beam LB is irradiated onto the initial processing region PR. Thus, energy of 232 mJ/cm² is absorbed by the silicon layer Si, and energy of 168 mJ/cm² is reflected. In the conventional laser crystallizing apparatus, the energy of 168 mJ/cm² dissipates. However, in the laser crystallizing apparatus according to the present exemplary embodiment, the energy of 168 mJ/cm² is applied to the processing region PR, the preheating region PRH, and the post-heating region POH.

FIG. 2 illustrates that an area of the preheating region PRH and an area of the post-heating region POH respectively correspond to half of an area of the processing region PR. Therefore, energy of 42 mJ/cm² that is a quarter of the energy of 168 mJ/cm² is irradiated onto the preheating region PRH, and the irradiated energy is used to preheat the amorphous silicon layer a-Si. In this case, the entire energy of 42 mJ/cm² is not absorbed by the amorphous silicon layer a-Si, and, as shown in Table 1, since the amorphous silicon layer a-Si has an absorption rate of 58%, energy of 24.36 mJ/cm² is absorbed by the amorphous silicon layer a-Si and used for preheating the amorphous silicon layer a-Si. Since the energy of 24.36 mJ/cm² is lower than 168 mJ/cm² transmitted to the processing region PR, the amorphous silicon layer a-Si may not be melted or mostly melted before the amorphous silicon layer a-Si moves to the processing region PR.

In addition, the energy of 232 mJ/cm² is not the only thing transmitted to the processing region PR. As described above, since the second region where the laser beam LB irradiated along the second path l2 includes the processing region PR, energy generated by the laser beam LB irradiated along the second path l2 is delivered to the processing region PR. FIG. 2 illustrates that the area of the processing region PR is half of the area of the second region (e.g., PRH, POH and PR), and accordingly, energy of 84 mJ/cm² that is half of the energy of 168 mJ/cm² is irradiated onto the processing region PR. In this case, the amorphous silicon layer a-Si is melted or mostly melted, and thus, according to Table 1, 51% of the energy of 84 mJ/cm² is absorbed by the silicon layer Si from the processing region PR. In other words, energy of 42.84 mJ/cm² is absorbed by the silicon layer Si from the processing region PR. Therefore, the energy absorbed by the silicon layer Si from the processing region PR is not just 232 mJ/cm² but 274.84 mJ/cm² that is a sum of 232 mJ/cm² and 42.84 mJ/cm². Therefore, the energy efficiency of the laser beam during the laser crystallization process may be increased.

As described above, during the process of crystallizing the amorphous silicon layer a-Si formed on the substrate SUB by using the laser beam LB while the stage ST moves in the +x direction, the amorphous silicon layer a-Si passes the post-heating region POH after passing the processing region PR. As the amorphous silicon layer a-Si is crystallized by passing the processing region PR and then passing the post-heating region POH, thermal stress of the polysilicon layer p-Si, which is generated during the crystallization process, may be distributed. If the thermal stress of the polysilicon layer p-Si is not distributed, various unwanted effects may occur, for example, an excessive number of protrusions may be formed on a surface of the polysilicon layer p-Si. However, in the laser crystallizing apparatus according to the present exemplary embodiment, post-heating may be performed without using a separate source, and thus, a substrate, on which a high-quality polysilicon layer p-Si is formed, may be manufactured with low manufacturing costs.

FIG. 2 illustrates that the area of the preheating region PRH and the area of the post-heating region POH are half of the area of the processing region PR, respectively. Thus, energy of 42 mJ/cm² that is a quarter of the energy of 168 mJ/cm² of the laser beam LB, which is incident on the amorphous silicon layer a-Si along the first path l1, is reflected, moves along the reflection path l1r, and is irradiated onto the post-heating region POH. In other words, the irradiated energy of 42 mJ/cm² is used to post-heat the polysilicon layer p-Si. In this case, all of the energy of 42 mJ/cm² is not absorbed by the polysilicon layer p-Si, and, as described with reference to Table 1, energy of 29.4 mJ/cm² is absorbed by the polysilicon layer p-Si and used to post-heat the polysilicon layer p-Si, since the polysilicon layer p-Si has the absorption rate of 70%.

When the amorphous silicon layer a-Si is crystallized by using the laser crystallizing apparatus according to the present exemplary embodiment, preheating and post-heating are performed without an additional source, and a ratio of energy transmitted from the processing region PR to the silicon layer Si may be increased.

As described above, the second region of the silicon layer Si where the laser beam is irradiated along the second path 12 includes the preheating region PRH, the processing region PR, and the post-heating region POH, but the inventive concept is not limited thereto.

Figure 3:
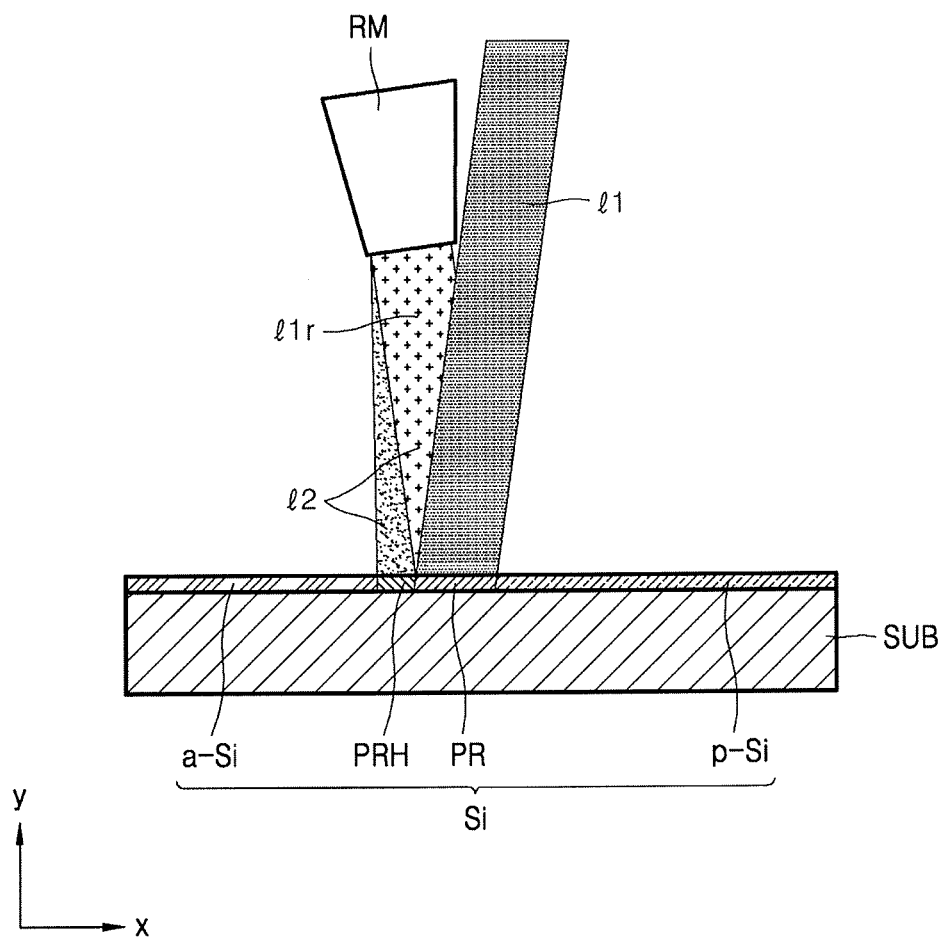
FIG. 3 illustrates a schematic diagram of a side portion of a laser-beam path with respect to a substrate, which is a part of a laser crystallizing apparatus, according to an exemplary embodiment of the inventive concept.

For example, FIG. 3 illustrates a schematic diagram of a side portion of a laser-beam path with respect to the substrate SUB, which is a part of the laser crystallizing apparatus, according to an exemplary embodiment of inventive concept. As shown in FIG. 3, the second region of the silicon layer Si where the laser beam LB is irradiated along the second path 12 may only include the preheating region PRH and the processing region PR. In other words, the second region may only include an external portion of the first region in a direction opposite to the +x direction in which the stage ST moves. This approach may be used in a case where stress in the polysilicon layer p-Si does not have to be relaxed through post-heating. For example, in a case where a high-quality polysilicon layer p-Si is not used.

Figure 4:
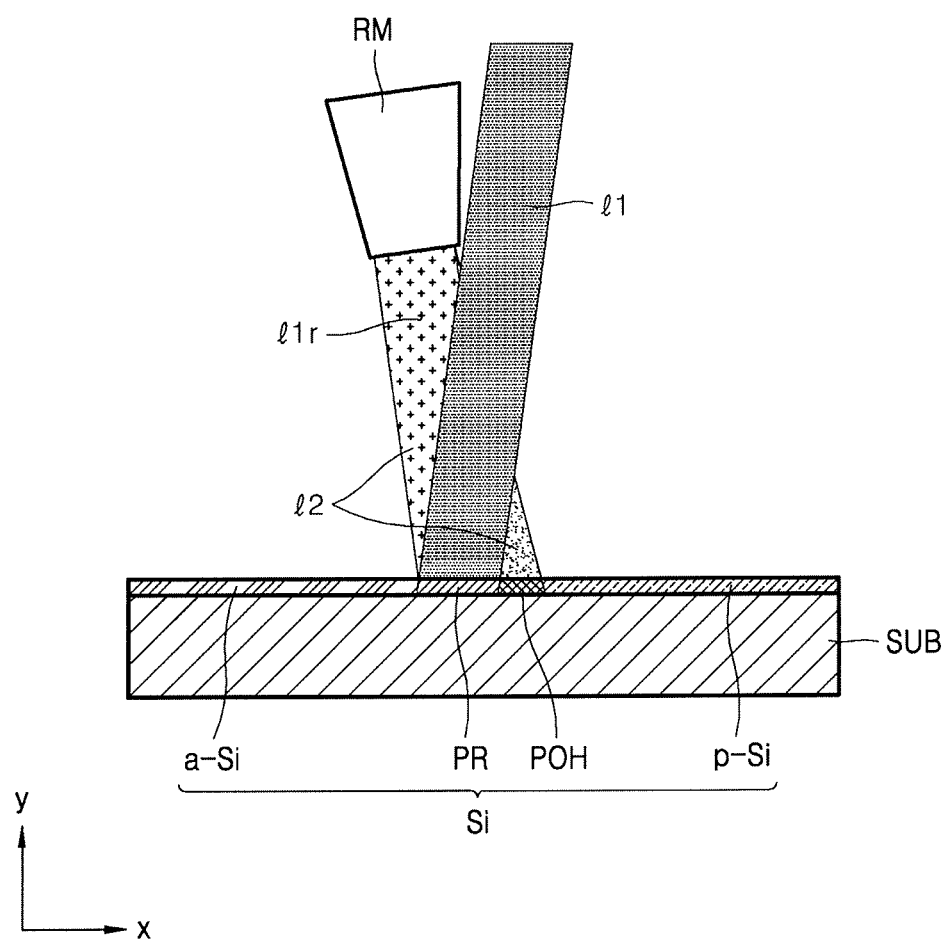
FIG. 4 illustrates a schematic diagram of a side portion of a laser-beam path with respect to a substrate, which is a part of a laser crystallizing apparatus, according to an exemplary embodiment of the inventive concept.

FIG. 4 illustrates a schematic diagram of a side portion of a laser-beam path with respect to the substrate SUB, which is a part of the laser crystallizing apparatus, according to an exemplary embodiment of the inventive concept. As illustrated in FIG. 4, the second region of the silicon layer Si where the laser beam LB is irradiated along the second path 12 may only include the processing region PR and the post-heating region POH. In other words, the second region may only include an external portion of the first region in the +x direction in which the stage ST moves. This approach may be used in a case where the preheating is not performed or is performed by increasing a temperature of the substrate SUB by using a heating plate instead of irradiating the laser beam onto the substrate SUB.

Figure 5:
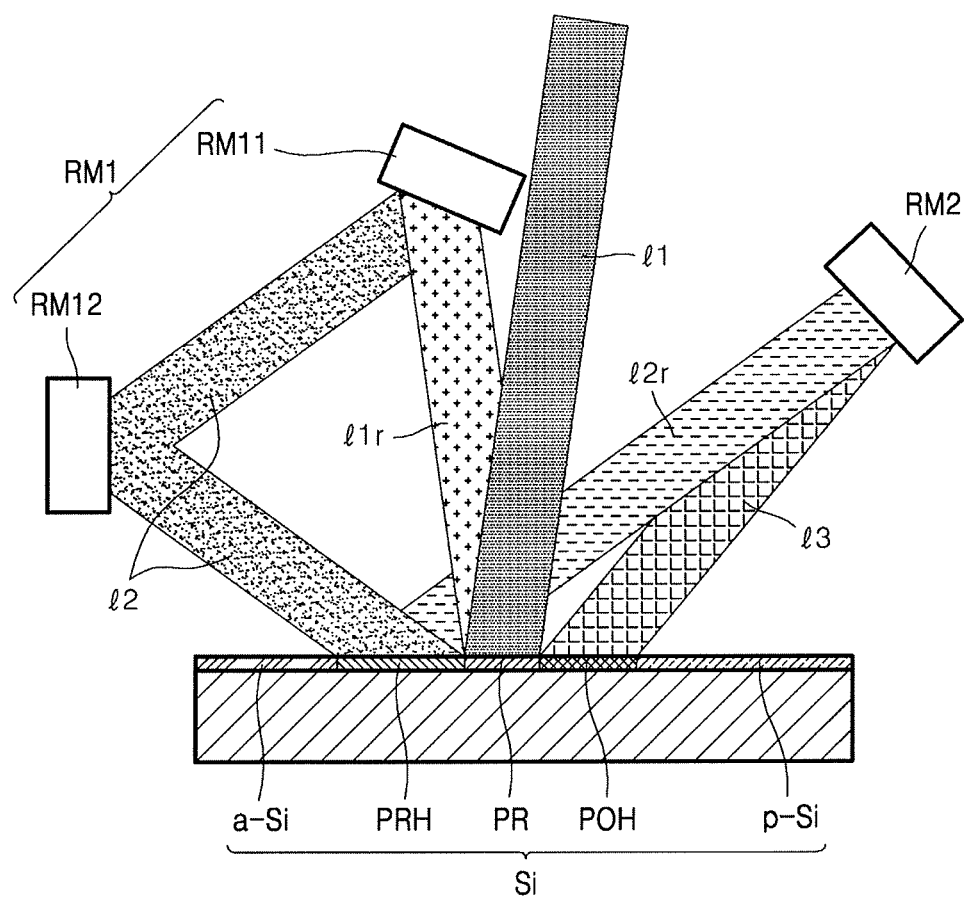
FIG. 5 illustrates a schematic diagram of a side portion of a laser-beam path with respect to a substrate, which is a part of a laser crystallizing apparatus, according to an exemplary embodiment of the inventive concept.

FIG. 5 illustrates a schematic diagram of a side portion of a laser-beam path with respect to the substrate SUB, which is a part of a laser crystallizing apparatus, according to an exemplary embodiment of the inventive concept. As illustrated in FIG. 5, the laser crystallizing apparatus includes a stage, a laser source, a chamber, a first reflection mirror RM1, and a second reflection mirror RM2. The stage, the laser source, and the chamber may be the same as and/or similar to the stage, the laser source, and the chamber described with reference to FIG. 1, and thus, descriptions thereof will be omitted.

A laser beam is emitted from the laser source and reaches the silicon layer Si formed on the substrate SUB disposed on the stage along the first path 11. The first reflection mirror RM1 then reflects the laser beam, which is provided to the first reflection mirror RM1 along a first reflection path 11r, and may irradiate the laser beam back onto the silicon layer Si. As illustrated in FIG. 5, the first reflection mirror RM1 includes a first main reflection mirror RM11 and a first supportive reflection mirror RM12 so that the laser beam moving along the first reflection path 11r is reflected twice and thus may move back toward the silicon layer Si. In this case, an area of the silicon layer Si where the laser beam moving along the second path 12 is irradiated may not overlap an area of the silicon layer Si where the laser beam moving along the first path 11 is irradiated. FIG. 5 illustrates that the area of the silicon layer Si where the laser beam moving along the second path 12 is irradiated is arranged adjacent to the area of the silicon layer Si where the laser beam moving along the first path 11 is irradiated. For example, the laser beam moving along the second path 12 contacts the silicon layer Si in an area that is to the left of where the laser beam moving along the first path 11 is irradiated. However, the inventive concept is not limited thereto.

When energy of the laser beam moving along the first path 11 is equal to 400 mJ/cm$^2$, energy of the laser beam moving along the first reflection path 11r becomes equal to 168 mJ/cm$^2$. Accordingly, energy absorbed by the preheating region PRH that is the amorphous silicon layer a-Si becomes equal to 97.44 mJ/cm$^2$ that is 58% of 168 mJ/cm$^2$. The energy may be used to preheat the amorphous silicon layer a-Si before crystallizing the amorphous silicon layer a-Si.

In this case, the laser beam having energy of 70.56 mJ/cm$^2$ that is 42% of 168 mJ/cm$^2$ is reflected again and then moves along a second reflection path 12r, and thus, the second reflection mirror RM2 reflects the laser beam moving along the second reflection path 12r so that the laser beam may move back toward the silicon layer Si along a third path 13. FIG. 5 illustrates that an area of the silicon layer Si where the laser beam moving along the third path 13 is irradiated is arranged adjacent to the area of the silicon layer Si where the laser beam moving along the first path 11 is irradiated. The laser beam moving along the third path 13 passes the processing region PR via the second reflection path 12r and then reaches the post-heating region POH that is a portion of the polysilicon layer p-Si, and thus, energy of 49.392 mJ/cm$^2$ that is 70% of 70.56 mJ/cm$^2$ is absorbed by the polysilicon layer p-Si. The energy may be used to distribute thermal stress in the polysilicon layer p-Si.

In the laser crystallizing apparatus according to the present exemplary embodiment, preheating, processing, and post-heating may be performed with one laser source LS, and thus, the energy use efficiency of the laser beam may be increased.

A method of manufacturing a substrate having a crystallized layer according to an exemplary embodiment of the inventive concept will now be described. In the following discussion, the crystallized layer may refer to a polysilicon layer.

In the method of manufacturing a substrate having a crystallized layer, as illustrated in FIG. 1, the laser beam LB emitted from the laser source LS is irradiated onto the substrate SUB, on which the target layer is formed, along the first path (11, also refer to FIG. 2). As illustrated in FIG. 2, the laser beam LB, which is emitted from the laser source LS, and reaches the silicon layer Si that is the target layer formed on the substrate SUB disposed on the stage ST, is reflected by using the reflection mirror RM, and then irradiated back onto the silicon layer Si formed on the substrate SUB, along the second path 12.

In this case, in the silicon layer Si formed on the substrate SUB disposed on the stage ST, the second region where the laser beam LB is irradiated along the second path 12 may be greater than the first region where the laser beam LB is irradiated along the first path 11. For example, as illustrated in FIG. 2, the second region may include the first region. In addition, a reflection surface of the reflection mirror RM may have a curved surface such as a convex surface.

FIG. 2 illustrates that the first region is the processing region PR, and the second region includes the processing region PR, the preheating region PRH, and the post-heating region POH. During the crystallization process using the laser beam, the stage ST moves in the +x direction, and thus, the substrate SUB disposed on the stage ST may move in the +x direction. Here, it may be understood that the preheating region PRH is an external portion of the first region to the left of the processing region PR, and the post-heating region POH is an external portion of the first region to the right of the processing region PR.

According to the above-described method of manufacturing a substrate having a crystallized layer, preheating, processing, and post-heating may be performed with one laser source LS, and thus, the energy use efficiency of the laser beam may be increased.

For example, during a process of crystallizing the amorphous silicon layer a-Si formed on the substrate SUB by using a laser beam while the stage ST moves in the +x direction, the amorphous silicon layer a-Si passes the preheating region PRH before passing the processing region PR. Accordingly, since the amorphous silicon layer a-Si is preheated before being melted or mostly melted in the processing region PR, a grain size may be increased when the amorphous silicon layer a-Si is finally crystallized.

In addition, during a process of crystallizing the amorphous silicon layer a-Si formed on the substrate SUB by using the laser beam while the stage ST moves in the +x direction, the amorphous silicon layer a-Si passes the post-heating region POH after passing the processing region PR. As the amorphous silicon layer a-Si is crystallized by passing the processing region PR and then passes the post-heating region POH, the terminal stress in the polysilicon layer p-Si, which is generated during the crystallization process, may be distributed.

The second region of the silicon layer Si where the laser beam is irradiated along the second path 12 includes the preheating region PRH, the processing region PR, and the post-heating region POH, but the inventive concept is not limited thereto.

For example, in a method of manufacturing a substrate having a crystallized layer according to an exemplary embodiment of the inventive concept, as illustrated in FIG. 3, the second region of the silicon layer Si where the laser beam is irradiated along the second path 12 may only include the preheating region PRH and the processing region PR. In other words, the second region may only include the external portion of the first region in the direction opposite to the +x direction in which the stage ST moves. This may occur in a case where stress in the polysilicon layer p-Si does not have to be relaxed through post-heating, since a high-quality polysilicon layer p-Si does not have to be used.

Alternatively, in a method of manufacturing a substrate having a crystallized layer according to an exemplary embodiment of the inventive concept, as illustrated in FIG. 4, the second region of the silicon layer Si where the laser beam is irradiated along the second path 12 may only include the processing region PR and the post-heating region POH. In other words, the second region may only include the external portion of the first region in the +x direction in which the stage ST moves. This may occur in a case where the preheating is not performed or is performed by increasing the temperature of the substrate SUB by using a heating plate instead of irradiating the laser beam onto the substrate SUB.

Hereinafter, a method of manufacturing a substrate having a crystallized layer according to an exemplary embodiment of the inventive concept will be described with reference to FIG. 5.

For example, with reference to FIG. 5, a laser beam emitted from a source is irradiated, along the first path 11, onto the substrate SUB on which the target layer, in other words, the silicon layer Si, is formed. The substrate SUB is disposed on a stage. Then, when a portion of the laser beam is reflected from the silicon layer Si and moves along the first reflection path 11r, the laser beam that is moved along the first reflection path 11r is reflected by using the first reflection mirror RM1 and irradiated back onto the silicon layer Si along the second path 12. The first reflection mirror RM1 may include the first main reflection mirror RM11 and the first supportive reflection mirror RM12.

In this case, an area of the silicon layer Si where the laser beam moving along the second path 12 is irradiated may not overlap an area of the silicon layer Si where the laser beam moving along the first path 11 is irradiated. FIG. 5 illustrates that the area of the silicon layer Si where the laser beam moving along the second path 12 is irradiated is adjacent to the area of the silicon layer Si where the laser beam moving along the first path 11 is irradiated. For example, the area of the silicon layer Si where the laser beam moving along the second path 12 is irradiated may be to the left of the area of the silicon layer Si where the laser beam moving along the first path 11 is irradiated. The laser beam moving along the second path 12 may be used to preheat the amorphous silicon layer a-Si before the amorphous silicon layer a-Si is crystallized.

The laser beam, which is reflected from the first reflection mirror RM1, reaches the silicon layer Si formed on the substrate SUB disposed on the stage via the second path 12, is again reflected, and moves along the second reflection path 12r. At this time, the laser beam is reflected by using the second reflection mirror RM2, and then is irradiated onto the silicon layer Si formed on the substrate SUB disposed on the stage along the third path 13. FIG. 5 illustrates that an area of the silicon layer Si where the laser beam moving along the third path 13 is irradiated is adjacent to the area of the silicon layer Si where the laser beam moving along the first path 11 is irradiated. For example, the area of the silicon layer Si where the laser beam moving along the third path 13 is irradiated is to the right of the area of the silicon layer Si where the laser beam moving along the first path 11 is irradiated. The laser beam moving along the third path 13 passes the processing region PR via the second reflection path 12r and reaches the post-heating region POH that is a portion of the polysilicon layer p-Si formed after crystallization and thus may be used to distribute the thermal stress in the polysilicon layer p-Si.

According to the method of manufacturing the substrate having the crystallized layer according to the present exemplary embodiment, the preheating, processing, and post-heating may be performed with one laser source LS, and thus, the energy use efficiency of the laser beam may be increased.

A display apparatus may be manufactured by the method of manufacturing the substrate having the crystallized layer in accordance with an exemplary embodiment of the inventive concept. For example, a display device such as an organic light-emitting device or liquid crystal device may be formed to be electrically connected to a thin film transistor (TFT) having the polysilicon layer p-Si that is crystallized through at least one of the methods described above, and thus, a display apparatus may be manufactured.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of manufacturing a substrate, the method comprising:

irradiating, along a first path, a laser beam emitted from a source onto a substrate, wherein the substrate includes a target layer of the laser beam, and wherein the substrate is disposed on a stage; and irradiating, along a second path, a portion of the laser beam, which was emitted from the source and reached the target layer, by reflecting the laser beam back onto the target layer using a reflection mirror, wherein an area of a second region of the target layer is greater than an area of a first region of the target layer, and wherein the laser beam is irradiated along the second path in the second region, and the laser beam is irradiated along the first path in the first region.

2. The method of claim 1, wherein the second region comprises the first region.

3. The method of claim 2, wherein, the reflection mirror comprises a convex reflection surface.

4. The method of claim 2, further comprising moving the stage in a first direction, wherein the second region comprises a region of the target layer outside the first region in a second direction opposite to the first direction.

5. The method of claim 2, further comprising moving the stage in a first direction, wherein the second region comprises a region of the target layer outside the first region in the first direction.

6. The method of claim 2, further comprising moving the stage in a first direction, wherein the second region comprises a region of the target layer outside the first region in a second direction opposite to the first direction and a region of the target layer outside the first region in the first direction.

7. The method of claim 1, wherein the first path is not perpendicular to the target layer.

8. The method of claim 1, wherein the target layer includes a silicon layer.

9. The method of claim 8, wherein the silicon layer includes an amorphous silicon layer.

10. The method of claim 1, wherein the target layer is crystallized.

11. A method of manufacturing a substrate to have a crystallized layer, the method comprising:

providing a laser beam onto a first region of a substrate disposed in a chamber;

reflecting a portion of the laser beam that contacted the substrate back onto a second region of the substrate by using a reflecting mirror disposed in the chamber, wherein an area of the second region is greater than an area of the first region; and moving a stage on which the substrate is disposed while the substrate is contacted with the laser beam.

12. The method of claim 11, wherein the laser beam first pre-heats a target layer on the substrate and then processes the target layer.

13. The method of claim 12, wherein the target layer includes amorphous silicon.

14. The method of claim 11, wherein the laser beam is provided from a single laser source.

15. The method of claim 11, wherein the area of the second region is about two times greater than the area of the first region.

* * * * *